United States Patent
Knüpfer et al.

(10) Patent No.: US 6,728,145 B2
(45) Date of Patent: Apr. 27, 2004

(54) SEMICONDUCTOR MEMORY WITH A SIGNAL PATH

(75) Inventors: Bernhard Knüpfer, Greiling (DE); Dirk Hottgenroth, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/158,275

(22) Filed: May 30, 2002

(65) Prior Publication Data
US 2002/0181298 A1 Dec. 5, 2002

(30) Foreign Application Priority Data
May 30, 2001 (DE) .......................... 101 26 312

(51) Int. Cl.[7] .............. G11C 7/00; G11C 7/02; G11C 8/00
(52) U.S. Cl. ............. 365/194; 365/189.03; 365/207; 365/225.7; 365/233
(58) Field of Search ............... 365/194, 189.03, 365/207, 225.7, 233

(56) References Cited

U.S. PATENT DOCUMENTS

| | | | | |
|---|---|---|---|---|
| 5,894,440 A | * | 4/1999 | Tsukude et al. | 365/190 |
| 6,009,040 A | * | 12/1999 | Choi et al. | 365/233 |
| 6,025,747 A | * | 2/2000 | Okayasu et al. | 327/407 |
| 6,366,990 B1 | * | 4/2002 | Guddat et al. | 711/167 |
| 6,385,101 B1 | * | 5/2002 | Chang et al. | 365/196 |
| 6,449,182 B1 | * | 9/2002 | Ooishi | 365/63 |
| 2002/0024840 A1 | * | 2/2002 | Noro et al. | 365/145 |
| 2003/0097535 A1 | * | 5/2003 | Hsu et al. | 711/169 |

* cited by examiner

*Primary Examiner*—David Nelms
*Assistant Examiner*—Ly Duy Pham
(74) *Attorney, Agent, or Firm*—Laurence A. Greenberg; Werner H. Stemer; Gregory L. Mayback

(57) ABSTRACT

A semiconductor memory has a data signal path and a control device in order to supply functional elements of the data signal path with control signals. Programmable delays are connected into the signal lines providing the control signals, so that the time relationships between the control signals can be set reversibly via a soft set register or irreversibly via fuses. This enables simple adaptation of the internal control signal timing to fluctuations in the fabrication process or after conversion of the configuration to a new fabrication process.

12 Claims, 3 Drawing Sheets

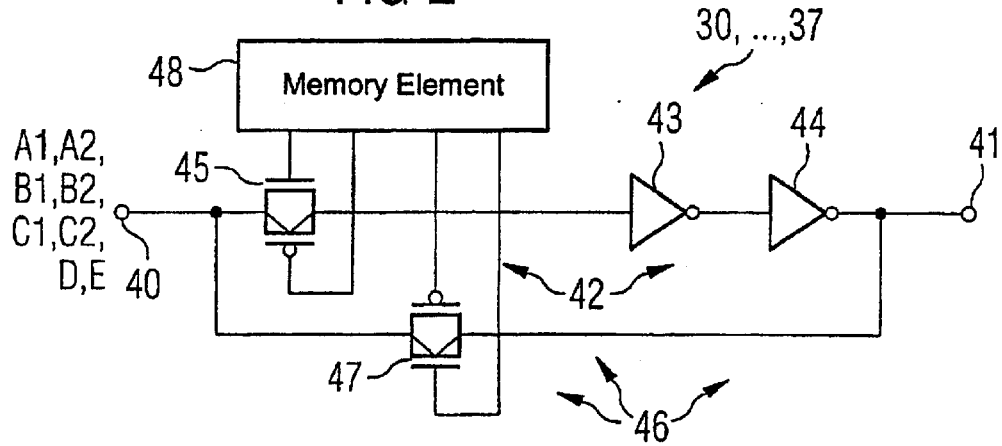
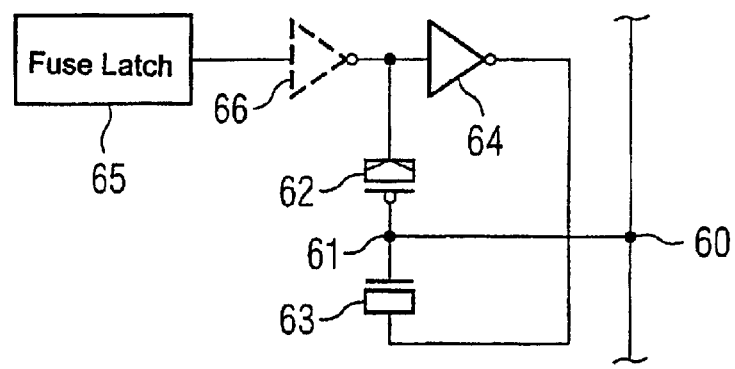
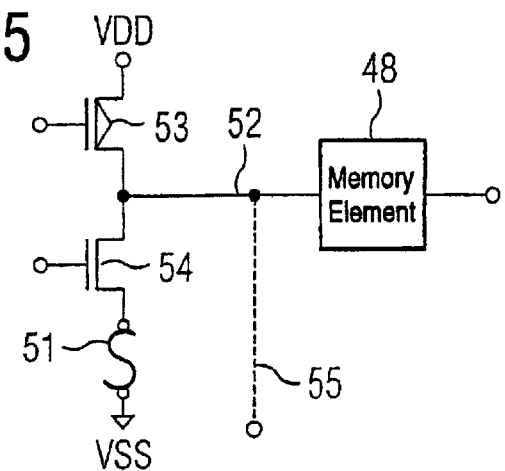

SEMICONDUCTOR MEMORY WITH A SIGNAL PATH

BACKGROUND OF THE INVENTION

FIELD OF THE INVENTION

The invention relates to a semiconductor memory containing word and bit lines and also memory cells connected thereto. A signal path is formed which contains one of the memory cells, the word and bit lines connected to the memory cell, and also circuit elements, in order to write a data value from an external terminal of the semiconductor memory to the memory cell or to output the data value from the memory cell to the external terminal. A control device is further provided and generates control signals for driving the signal path.

Integrated semiconductor memories, for example so-called dynamic random access memories (DRAMs), contain a memory cell array with a multiplicity of mutually crossing word and bit lines. The memory cells are in each case disposed at the crossover points between a word line and a bit line and are connected thereto. The word line activates an access to the memory cell, while a data value is read out or written to the memory cell via the bit line. The word lines are driven by a word line decoder that selects at least one word line from the multiplicity of word lines in a manner dependent on an address. The bit lines are usually connected in pairs as bit lines carrying complementary data signals to a primary sense amplifier. The primary sense amplifier amplifies a data value that originates from that memory cell whose word line is activated. By way of example, all the primary sense amplifiers of the memory cell array provide such a data value. Afterward, one of the sense amplifiers is selected by a bit line decoder in order to forward its data value to a secondary sense amplifier. The secondary sense amplifier outputs the data signal to be read out with sufficient amplification to further signal lines which are connected to a data output terminal of the semiconductor memory. The data can be tapped off externally at the data output terminal. Conversely, an input signal applied to the data output terminal is written to a memory cell selected via a word line decoder and a bit line decoder. All the control measures of the signal path described are monitored by a control device. Depending on commands applied to the control device, on the output side a multiplicity of control signals are generated which activate and deactivate again the respective functional units of the signal path for writing and for reading data values with correct timing.

In conventional DRAMs, write accesses and read accesses are controlled internally within the module by a fixed sequence of control signals. By way of example, the internal control signals follow the commands, usually applied externally by a memory controller, as quickly as possible. In many cases, a signal is also delayed with a fixedly predetermined time in order to be provided in a correctly timed manner. The internal signal processing is fixedly dependent on the configured circuit and can no longer be altered subsequently.

Owing to the advancing miniaturization of the components on account of ever smaller structure widths that can be fabricated in the integrated fabrication process, a module configuration is repeatedly adapted to new fabrication processes. The predictability of the signal propagation times and of the switching times of the functional elements proceeding from a circuit configuration that is transferred to a new fabrication process therefore becomes problematic.

Moreover, variations in the electrical parameters are established anyway on account of fluctuations in the fabrication process. This can have the effect that the functional properties of the same configuration deviate from one another and, in the extreme case, even the entire semiconductor memory must be assessed as non-functional. Since the market for semiconductor memories is short-lived and innovations have to be implemented as quickly as possible, an adaptation of the configuration or of the circuit layout would delay the availability of a new semiconductor memory to an undesirable extent.

SUMMARY OF THE INVENTION

It is accordingly an object of the invention to provide a semiconductor memory with a signal path that overcomes the above-mentioned disadvantages of the prior art devices of this general type, which can be adapted more quickly to changes in the fabrication process while adhering to the same electrical functionality.

With the foregoing and other objects in view there is provided, in accordance with the invention, a semiconductor memory. The memory contains word lines, bit lines crossing the word lines, memory cells each connected to a word line and a bit line, and a signal path. The signal path contains a respective memory cell of the memory cells, the word line and the bit line connected to the respective memory cells, an output terminal, and circuit elements for writing a data value present at the output terminal to the respective memory cell or to output the data value from the respective memory cell to the output terminal. A control device is provided for generating control signals for activating and deactivating the circuit elements of the signal path. At least one delay circuit with an adjustable signal delay to accelerate or to delay at least one of the control signals with the adjustable delay time. The delay circuit is connected between the control device and at least one of the circuit elements.

The invention provides for the control signals which drive the functional units of the signal path for read-in or read-out purposes to be provided with an adjustable, preferably irreversibly programmable delay time. Therefore, after the conversion of a configuration to a new fabrication process, the respective delay time of the affected control signals can be adapted. Both a delay and an acceleration are conceivable. In the sense of the invention, a programmable delay also includes an acceleration of the propagation of a signal along a signal path. Moreover, when testing an individual semiconductor module, the internal signal propagation times thereof can be set finely in order to compensate for parameter variations on account of fluctuations in the fabrication process. Consequently, an identical or only slightly altered configuration can be produced relatively quickly in a new semiconductor process. A separate simulation of the semiconductor module, which would require many different conditions and safety margins for critical signals, is no longer necessary to this high degree. Rather, there is adaptation, if appropriate individually for each module, of the relationship of signal propagation times within the semiconductor memory in the core area of the memory.

The adaptation can be set reversibly and by a so-called soft set or irreversibly by permanent programming of a so-called fuse or antifuse. All the control signals that are relevant when reading in or reading out data can be individually delayed or accelerated in this way.

By way of example, the signal path whose control signals are to be adapted contains all the circuit elements in order to write a data value present at an external terminal, a pin, of the semiconductor memory to one of the memory cells or to output a data value from the memory cell to such an output terminal. The circuit elements of the signal path are controlled by the control device outputting control signals in order to be activated or deactivated, that is to say to be enabled or blocked. The signal path contains for example a word line decoder, in order to select at least one of the word lines from the multiplicity of word lines disposed in the memory cell array. The word line decoder is enabled by a corresponding control signal that is generated by the control device. Now, according to the invention, a delay circuit whose delay time can be set reversibly or irreversibly, is connected between the relevant output of the control device and the corresponding enable input of the word line decoder. In this case, a delay time also refers to a possible acceleration of the signal propagation time relative to a preset initial state. Furthermore, the signal path contains a primary sense amplifier to which at least one of the bit lines is connected. The primary sense amplifier is again activated and deactivated by at least one control signal. A secondary sense amplifier is connected downstream of a multiplicity of primary sense amplifiers and selects one of the multiplicity of data signals of the memory cell array that are offered by the primary sense amplifiers. Both the selection circuit, the so-called bit line decoder, and the secondary sense amplifier itself can be activated and deactivated by respective control signals.

Semiconductor memories are conventionally provided with bit lines that carry complementary signals and are jointly connected to a primary sense amplifier. Before a read-in or read-out operation, a potential of the bit lines among one another is equalized by the bit lines being short-circuited. In a refinement of the invention, the control signal provided by the superordinate control device is accelerated or delayed in a programmable manner along the signal line from the control device to the equalization transistor.

Various possibilities are conceivable as an embodiment of one of the multiplicity of delay circuits for the respective control signals. Thus, on the one hand, it is possible to provide a conventional delay line that contains, for example, two cascaded inverters and is connected in series with a programmable switch. Connected in parallel with that is a switchable signal line without such a delay path. The two switches are embodied in a complementarily controllable manner, for example as transfer gates. Thus, either the signal path containing the delay elements is switched on and delays the signal on the way from the control device to the functional unit of the data signal path that is to be controlled. On the other hand, the delay path can be switched off and the faster signal path containing no such delay path is switched on.

As an alternative, a capacitive element connected to the respective signal line carrying the control signal is suitable for the signal delay. The capacitive element contains, for example, complementary MOS field-effect transistors whose gate terminals are interconnected and whose controlled current paths are connected to one another via an inverter. The gate terminals are additionally coupled to the signal line. The input terminal of the inverter that connects the two transistors is finally driven by the programmable element, either a fuse or a soft set register. Depending on the switching state of the programmable element, the capacitance becomes active and modulates an edge of the signal transmitted on the line or remains inactive.

An acceleration of a signal can be achieved by an inverter additionally being connected into the signal line that transmits a control signal. By way of example, the signal line is connected to the input of the inverter and is tapped off from the output of the inverter. The inverter is connected to the supply terminals via respective complementary transistors. If the transistors are switched on, the signal line has an increased driver capability. If the transistors are switched off, the inverter is not active and the line has only a low driver capability. In this way, it is possible either to reduce or increase the delay time along the signal line depending on the presetting of the additional inverter.

All the embodiments of the delay element described can be driven by a soft set register or by a fuse latch. The soft set register has a data value written to it during operation, for example in the course of the initialization of the semiconductor module, and sets the respective switches that are active in the delay element. A fuse latch contains a programmable element, a so-called fuse, which is permanently, irreversibly programmable. The fuse is conducting in the initial state and non-conducting in the programmed state. Nevertheless, it is also possible to use an antifuse that is non-conducting in the initial state and is conducting in the programmed state. The circuitry of the fuse/antifuse provides either a high level or a low level, between which a changeover is made in each case by programming. The logic level output by the programmed or non-programmed fuse is finally read into a memory element that sets the switches that are active in the delay element.

Other features which are considered as characteristic for the invention are set forth in the appended claims.

Although the invention is illustrated and described herein as embodied in a semiconductor memory with a signal path, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block circuit diagram of a first embodiment of a programmable delay element;

FIG. 3 is a block circuit diagram of a second embodiment of the programmable delay element;

FIG. 5 is a circuit diagram of an example of the circuitry of a fuse.

DESCRIPTION OF THE PREFERRED EMBODIMENTS

Figure 1:
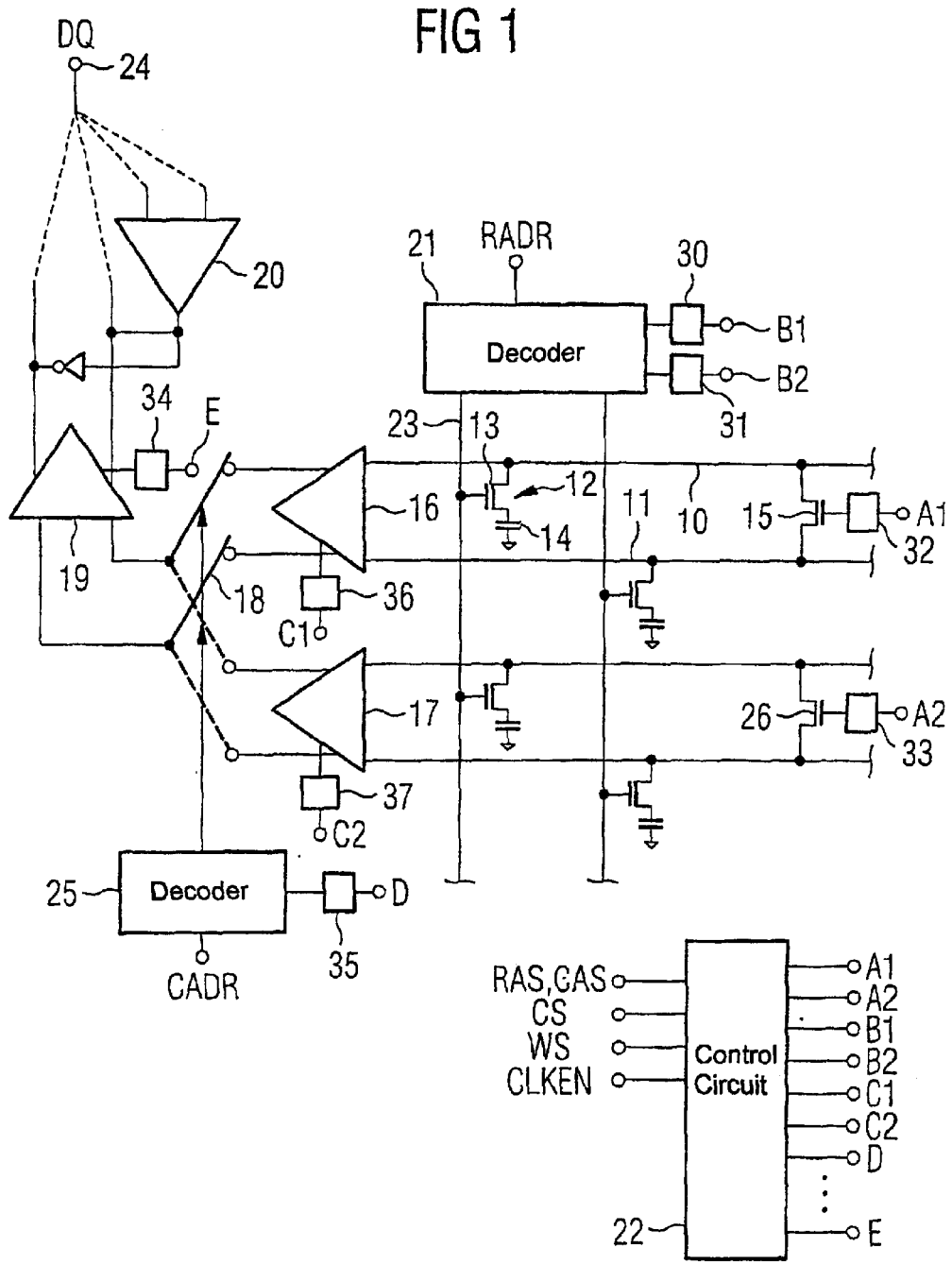
FIG. 1 is a block circuit diagram of a detail from a dynamic semiconductor memory according to the invention.

Referring now to the figures of the drawing in detail and first, particularly, to FIG. 1 thereof, there is shown a detail from a dynamic semiconductor memory (DRAM) containing a memory cell array having dynamic memory cells 12. The memory cell 12 has a selection transistor 13 and a storage capacitor 14. On a gate side, the selection transistor 13 is connected to a word line 23. A controlled path of the selection transistor 13 is connected to a bit line 10. In order to read out a data value represented by a quantity of charge stored in the storage capacitor 14, the selection transistor 13 is turned on by activation of the word line 23. For this purpose, the word line 23 is brought from an inactive level, which is ground or a negative potential, to a high level. The transistor 13 turned on in this way thereupon connects the capacitor 14 to the bit line 10. The bit line 10 is connected to a primary sense amplifier 16, to which a complementary bit line 11 is additionally connected. Both bit lines 10, 11 are connected to one another before the read-out operation by a turned-on equalization transistor 15 and were short-circuited and held at a precharge potential. For the read-out, on the one hand the equalization transistor 15 is turned off and, as described, the selection transistor 13 is turned on. The asymmetry introduced by a charge in the storage capacitor 14 to the pair of complementary bit lines 10, 11 is amplified by the primary sense amplifier 16. A multiplicity of sense amplifiers 16, 17 are present in the memory cell array. Via a selection switch 18, the complementary, preamplified data signals present at one of the primary sense amplifiers 16, 17 are forwarded and fed into a secondary sense amplifier 19. The secondary sense amplifier 19 makes the data signal available to downstream circuits on the way to a data output terminal 24, where a data signal DQ is present for tapping off externally and outside the semiconductor memory. During writing, the signal transfer is effected in reverse order from the external data terminal 24, now serving as a data input, via further-processing circuits and a write amplifier 20 to the sense amplifier 19 and back via the selection switch 18 to the sense amplifier 16 into the memory cell 12. A word line decoder 21, to which an address RADR is fed, serves for the selection of one of the word lines, for example the word line 23. A bit line decoder 25 selects one of the primary sense amplifiers, for example, the sense amplifier 16, from the multiplicity of sense amplifiers present and connects it to the secondary sense amplifier 19. The bit line decoder 25 makes the selection in a manner dependent on a supplied address CADR.

A control circuit 22 is provided which generates control signals A1, A2, B1, B2, C1, C2, D, E from externally provided input signals, for example read or write commands or refresh commands, which control signals control the functional units just described in the read-out and read-in signal path. By way of example, the row and column access signals RAS, CAS, a write control signal WE and a chip select signal CL and also a clock enable signal CLKEN are supplied in the control circuit 22 functioning as a decoder 22. The decoder 22 is a state machine and finally generates from the decoded signals the output-side control signals mentioned, in order to control read and write accesses and refresh operations.

By way of example, the control signal A1 is fed to the equalization transistor 15. The control signal A2 controls the equalization transistor 26 of the adjacent complementary bit line pair. The control signal B1 controls the switch-on or activation of a word line and is accordingly fed to the word line decoder 21. Depending on the state of the control signal B1, a high level is applied to a selected word line, e.g. the word line 23. The control signal B2 controls the switch-off of all the word lines by the latter being brought to a low level or even to a negative level. The word lines are thereby deactivated. This operation is also referred to as precharge. The control signal C1 activates the amplification operation of the primary sense amplifier 16. The control signal C2 accordingly activates the amplification operation of the primary sense amplifier 17. Finally, the signal D activates the selection of one of the primary sense amplifiers 16, 17, for example of the sense amplifier 16. The control signal E activates the concluding amplification operation during read-out in the secondary sense amplifier 19.

The provision of the control signals A1, . . . , E by the state machine 22 in each case relative to one another within certain time windows is important in order to ensure a proper access to one of the memory cells both for reading and for writing of data values. All the internal pulses and edges of control signals must have a certain minimum and maximum spacing with respect to one another in order that the semiconductor module functions correctly within the external signal specifications. If, in an undesirable manner, for instance, the selection of one of the primary sense amplifiers 16 or 17 is effected to quickly after a switch-on pulse B1 for the word lines, then the level difference on the complementary bit lines would not yet be large enough and charges situated on the connecting lines to the secondary sense amplifier 19 might toggle during the forwarding of the bit line levels. The incorrect signal would then be written back to the selected cell. Also critical is the time when writing data values to a memory cell from the secondary sense amplifier 19 to one of the primary sense amplifiers 16, 17 via the capacitances and resistances of the bit lines and selection transistors involved. Finally, an excessively short interval between a switch-off pulse B2 for the word line and the pulse A1 or A2 for the switch-on of the equalization transistors is critical.

A delay circuit 30, . . . , 37 or an acceleration circuit is now connected into the signal line from the control device 22 to the respective reception location for the control signal A1, . . . , E provided. As a result, the internal control signals can be delayed or accelerated by an exactly defined time, as is explained using the circuits illustrated below. According to the invention, the signal delay for the control signals output by the state machine 22 can be set subsequently. As a result, it is possible to compensate for fluctuations on account of the fabrication process, or alternatively, in the event of a conversion of the previously existing, simulated layout to a new fabrication process, the same configuration can be used and the signal propagation times can be adapted in a programmable manner.

By way of example one or all of the delay circuits 30, . . . , 37 can be embodied in the manner illustrated in FIG. 2. The delay circuit has, between its input and output terminals 40, 41, a first delay path 42 having two series-connected delay elements embodied as inverters 43, 44. A switch 45 embodied as a transfer gate is connected in series with the inverters 43, 44. A signal path 46 is connected in parallel with the series circuit formed by the transfer gate 45 and the delay elements 43, 44, which signal path contains only a transfer gate 47 but otherwise contains an interconnect and, in particular, contains no additional delay element comparable to the inverters 43, 44. The transfer gates 45, 47 are controlled complementarily with respect to one another. Thus, either the signal path 42 is active and the signal path 46 is disabled, or the signal path 46, which brings about a less signal delay time onto the control signal, is active and the signal path 42 is disabled. The switches 45, 47 are set via a memory element 48.

As illustrated in FIG. 5, for example, the memory element 48 is a simple latch that stores a high or low level. The level to be stored is prescribed by a fuse 51. The fuse 51 is on the one hand connected to a ground potential VSS and is on the other hand connected to a positive supply potential VDD via the series circuit formed by an n-channel and a p-channel field-effect transistor. For reading from the fuse 51, the circuit node 52 is precharged via a turned-on p-channel transistor 53. Afterward, the transistor 53 is turned off and the n-channel transistor 54 is turned on. In the exemplary embodiment shown, the fuse 51 is unchanged with respect to its initial state and pulls the precharge potential that is momentarily set at the terminal 52 to ground potential VSS. The latter is stored in the latch 48 and, for example, turns the switch 47 on and the switch 45 off, so that a delay-free signal path 46 is activated. The fuse 51 is interrupted by the action of an energy pulse, e.g. of a laser beam. During read-out, the precharge level that is momentarily set at the terminal 52 is then preserved and the memory element 48 outputs a high level. The correspondingly assigned fuses can be set for all of the adjustable delay elements 30, ..., 37. It is noted in supplementation that, instead of fuses 51, it is also possible to use antifuses that are non-conducting in the initial state and are switched to conducting by the action of a laser pulse.

As an alternative to the delay circuit shown in FIG. 2, it is possible to use a capacitive delay as shown in FIG. 3. A control line 60 supplied with the control signal by the control device 22 is loaded with a capacitive node 61. The capacitance is formed by a p-channel transistor 62 and an n-channel transistor 63, whose gate terminals are connected to the node 61. For their part, the current path terminals of the transistors 62, 63 are coupled to one another at the respective transistors and, on the other hand, are coupled together via an inverter 64. An input of the inverter 64 is connected to the current path terminals of the p-channel field-effect transistor 62. Moreover, on the input side, the inverter 64 is connected to a fuse latch 65, comparable to the fuse latch illustrated in FIG. 5. If the fuse latch 65 outputs a high level, that is to say if the fuse 51 has been treated by a laser at high impedance, then a charge is introduced into the channels of the transistors 62, 63. A signal edge propagating along the line 60 modulates, via the circuit node 61, the quantity of charge stored in the capacitors 62, 63, so that a capacitive effect and, consequently, a signal delay are established on the line 60. A non-severed fuse ensures that the channels of the transistors 62, 63 are discharged and the capacitive effect on the line 60 is negligibly small. If an inverter 66, illustrated by broken lines in FIG. 3, is additionally disposed at the output of the fuse latch 65, then the circuit acts as a capacitance that can be switched off. In this case, a non-severed fuse switches an effective capacitance onto the signal line 60 and a severed, laser-programmed fuse switches off the capacitance in a reversal of the principle of action described above. It is thus possible, compared with the initial state, to accelerate the signal along the line 60, in other words the delay time of a signal edge propagating along the line 60 is shorter in the programmed state of the fuse than in the unprogrammed state.

Figure 4B:
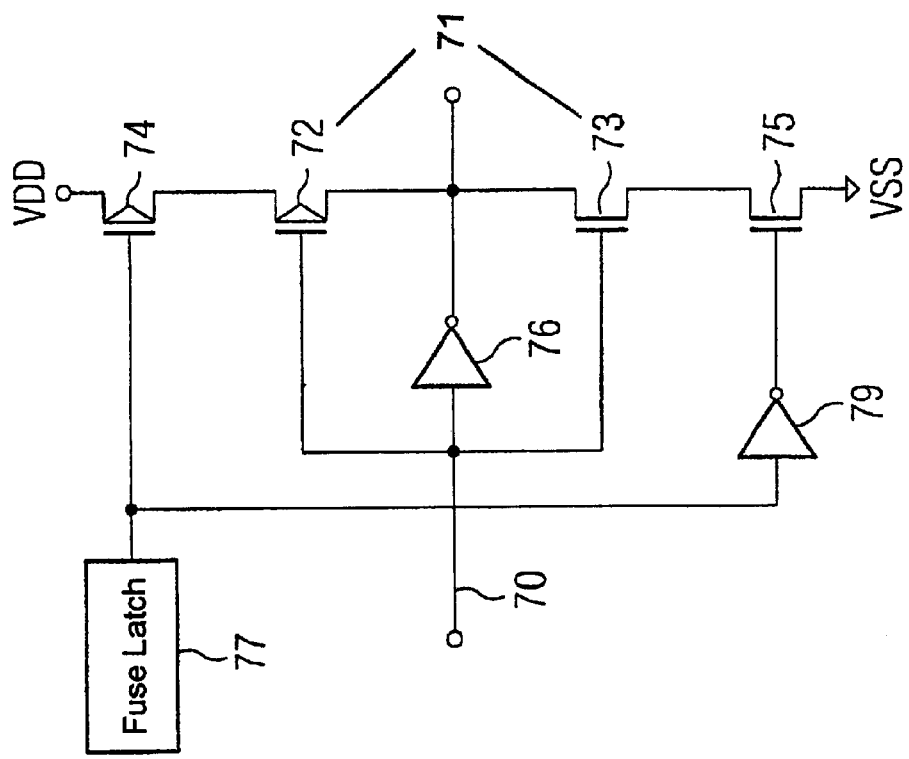
FIGS. 4a and 4b are block circuit diagrams of a third embodiment of the programmable delay element.
Figure 4A:
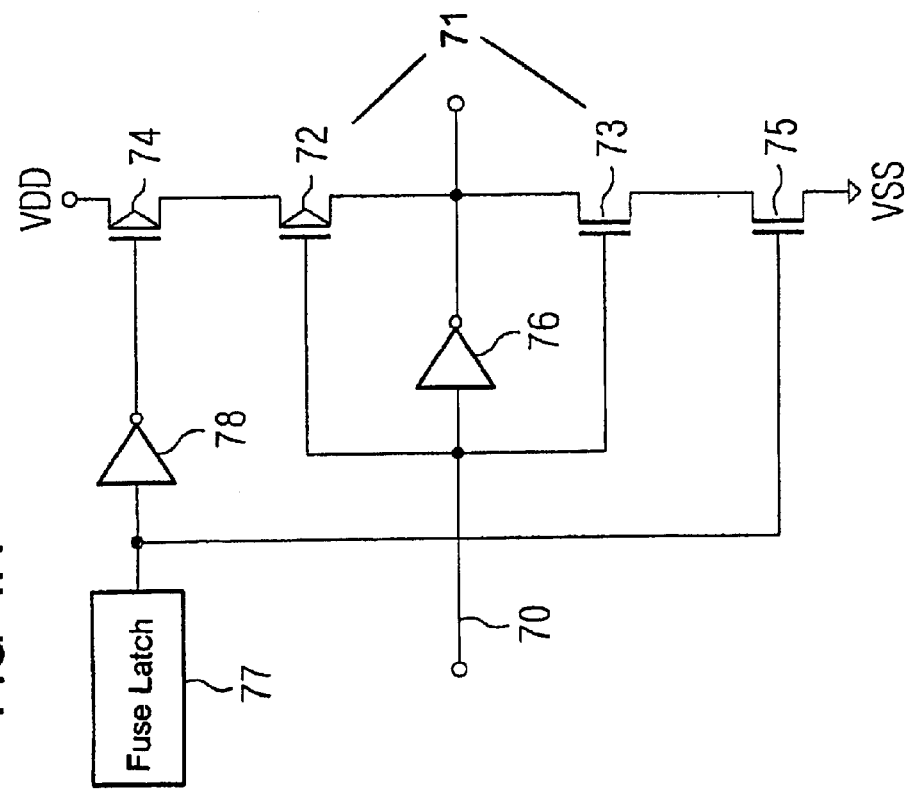

Another alternative embodiment for a programmable delay or acceleration is illustrated in FIGS. 4A and 4B. FIG. 4A shows the circuitry for an acceleration. Corresponding elements are provided with the same reference symbols. A signal line 70 has an inverter 71 formed of a p-channel field-effect transistor 72 and an n-channel field-effect transistor 73. On the supply potential side, the transistor 72 is connected to the supply potential VDD via a further p-channel field-effect transistor 74, and the transistor 73 is correspondingly connected via a further n-channel transistor 75 to a terminal for ground potential VSS. The signal line 70 drives the input of the inverter 71 and is extended to the output thereof. The input and the output of the inverter 71 are coupled via a further inverter 76. The transistors 74, 75 on the current path side are driven by a fuse latch 77. An inverter 78 provides for complementary driving of the transistors 74, 75. If the fuse is not programmed, i.e. the fuse latch has a low level, then the transistors 74, 75 are turned off and the inverter 71 is not active. If the fuse is programmed and the fuse latch 77 therefore outputs a high level, the transistors 74, 75 are turned on and additionally switch the inverter 71 onto the line 70. The driver capability of the line 70 is thereby increased and an edge of one of the control signals A1, ..., E propagating along the line 70 is accelerated. In FIG. 4B, the driving polarity for the transistors 74, 75 is embodied in opposite fashion, an inverter 79 drives the transistor 75, while the transistor 74 is driven directly by the fuse latch 77. By programming the fuse, it is possible here to increase the delay time along the line 70, in other words a signal delay is affected for the control signal propagating along the line 70.

A terminal 55 is illustrated by broken lines in FIG. 5, which terminal is connected to a terminal 52 forming the input of the volatile memory element 48. The terminal 55 is to be seen as an alternative to the fuse 51 and the transistors 53, 54. A data value representing a logic high or logic low level is applied to the terminal 55 during operation, preferably during the initialization phase of the semiconductor memory. The data value is buffer-stored in the volatile memory element 48, preferably a register. Thus, by way of example, during the semiconductor memory test, the delay time for the control signals output by the control device 22 can be set in a variable manner.

We claim:

1. A semiconductor memory, comprising:

word lines;

bit lines crossing said word lines;

memory cells each connected to a word line of said word lines and a bit line of said bit lines;

a signal path containing a respective memory cell of said memory cells, said word line and said bit line connected to said respective memory cells, an output terminal and circuit elements for writing a data value present at said output terminal to said respective memory cell or to output the data value from the respective memory cell to said output terminal, said circuit elements of said signal path including:

a word line decoder connected to and driving at least one of said word lines;

a primary sense amplifier connected to at least one of said bit lines;

a secondary sense amplifier connected downstream of said primary sense amplifier; and a selection circuit connected between said primary sense amplifier and said secondary sense amplifier for connecting said primary sense amplifier to said secondary sense amplifier;

a control device for generating control signals for activating and deactivating said circuit elements of said signal path; and at least one delay circuit with an adjustable signal delay to accelerate or to delay at least one of the control signals with the adjustable delay time, said delay circuit connected between said control device and at least one of the circuit elements.

2. The semiconductor memory according to claim 1, wherein said signal path contains, in pairs, said bit lines which are jointly connected to said primary sense amplifier, and an equalization circuit connected between said bit lines forming a pair for connecting said bit lines to one another, and said equalization circuit is connected to said control device through said delay circuit.

3. The semiconductor memory according to claim 1, wherein said delay circuit contains a programmable element, a series circuit having a first switch and a delay element, and a second switch connected in parallel with said series circuit, said first and second switches connected to and driven complementarily by said programmable element.

4. The semiconductor memory according to claim 3, wherein said delay element contains at least one inverter.

5. The semiconductor memory according to claim 1, wherein said delay circuit contains a signal line connected to said control device and carrying one of the control signals, a programmable element, and a capacitive delay element connected to said signal line and coupled to said programmable element, said capacitive delay element having an effective capacitance switchable by said programmable element.

6. The semiconductor memory according to claim 5, wherein:

said delay circuit has an inverter connected to said programmable element; and said capacitive delay element contains at least two capacitors formed from complementary field-effect transistors having gate electrodes connected to one another and connected to said signal line, said complementary field-effect transistors having further terminals coupled to one another through said inverter and to said programmable element.

7. The semiconductor memory according to claim 6, wherein said programmable element has an output;

wherein said inverter has an input; and further comprising a further inverter connected between said output of said programmable element and said input of said first inverter.

8. The semiconductor memory according to claim 1, wherein said delay circuit contains:

a signal line carrying one of the control signals and connected to said control device;

an inverter having an input side and an output side, said input side and said output side coupled to said signal line;

terminals for supply potentials;

transistors each connected to said terminals, said inverter coupled to each of said terminals through one of said transistors; and a programmable element coupled to and controlling said transistors complementarily.

9. The semiconductor memory according to claim 3, wherein said programmable element is a volatile memory element configured for storing an externally input data value.

10. The semiconductor memory according to claim 5, wherein said programmable element is a volatile memory element configured for storing an externally input data value.

11. The semiconductor memory according to claim 8, wherein said programmable element is a volatile memory element configured for storing an externally input data value.

12. The semiconductor memory according to claim 3, wherein said programmable element contains a volatile memory element and an irreversibly programmable element, selected from the group consisting of fuses and antifuses, coupled to said memory element.

* * * * *